United States Patent
Okada

(10) Patent No.: US 7,969,261 B2
(45) Date of Patent: Jun. 28, 2011

(54) TRANSMISSION LINE SUBSTRATE HAVING OVERLAPPING GROUND CONDUCTORS THAT CONSTITUTE A MIM CAPACITOR

(75) Inventor: Norio Okada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 193 days.

(21) Appl. No.: 12/392,504

(22) Filed: Feb. 25, 2009

(65) Prior Publication Data
US 2010/0060390 A1    Mar. 11, 2010

(30) Foreign Application Priority Data
Sep. 9, 2008 (JP) .................. 2008-231070

(51) Int. Cl.
*H01P 3/08* (2006.01)
(52) U.S. Cl. .................. 333/246; 333/24 C
(58) Field of Classification Search .......... 333/24 C, 333/33, 246
See application file for complete search history.

(56) References Cited

U.S. PATENT DOCUMENTS
5,777,528 A * 7/1998 Schumacher et al. .......... 333/33
7,046,100 B2 * 5/2006 Yagisawa et al. ........... 333/24 C FOREIGN PATENT DOCUMENTS
| JP | 11-163272 | 6/1999 |
| JP | 2000-68714 | 3/2000 |
| JP | 2000-244209 | 9/2000 |
| JP | 2002-100906 | 4/2002 |

* cited by examiner

Primary Examiner — Benny Lee
(74) *Attorney, Agent, or Firm* — Oblon, Spivak, McClelland, Maier & Neustadt, L.L.P.

(57) ABSTRACT

A transmission line substrate includes: a dielectric substrate; a signal line disposed on the upper surface of the dielectric substrate; first and second ground conductors disposed on the upper surface of the dielectric substrate, field-coupled to the signal line, having potentials different from each other; a dielectric film disposed between an overlapping part of the first ground conductor and a part of the second ground conductor at which the first and second ground conductors overlap each other, to constitute a MIM capacitor; a capacitor connected between the first ground conductor and the second ground conductor in parallel with the dielectric film; and a resistor connected between the first ground conductor and the second ground conductor in series with the capacitor.

3 Claims, 3 Drawing Sheets

TRANSMISSION LINE SUBSTRATE HAVING OVERLAPPING GROUND CONDUCTORS THAT CONSTITUTE A MIM CAPACITOR

BACKGROUND OF THE INVENTION

1. Field of the Invention

The present invention relates to a transmission line substrate having a coplanar line, and more especially to a transmission line substrate that can transmit signals over a broad band.

2. Background Art

A transmission line substrate having a coplanar line has been known (for example, refer to Japanese Patent Laid-Open No. 2000-244209). In some cases, the ground conductor of the coplanar line has two potentials. In this case, in a conventional transmission line substrate, two ground conductors having different potentials were AC-coupled.

SUMMARY OF THE INVENTION

Conventional transmission line substrates had a problem wherein electric fields around a capacitor were distorted in a high frequency of 40 GHz or higher, and frequency response characteristics were deteriorated.

To solve such a problem, it is an object of the present invention to obtain a transmission line substrate that can transmit signals over a broad band.

According to one aspect of the present invention, a transmission line substrate comprises: a dielectric substrate; a signal line disposed on the upper surface of the dielectric substrate; first and second ground conductors disposed on the upper surface of the dielectric substrate and each including a part in which the first and second ground conductors overlap each other, field-coupled to the signal line, having potentials different from each other; a dielectric film disposed between the part of the first ground conductor and the part of the second ground conductor that overlap each other to constitute a MIM capacitor; a capacitor connected between the first ground conductor and the second ground conductor in parallel with the dielectric film; and a resistor connected between the first ground conductor and the second ground conductor in series with the capacitor.

According to the present invention, signals can be transmitted over a broad band.

Other and further objects, features and advantages of the invention will appear more fully from the following description.

DETAILED DESCRIPTION OF THE PREFERRED EMBODIMENTS

First Embodiment

Figure 1:
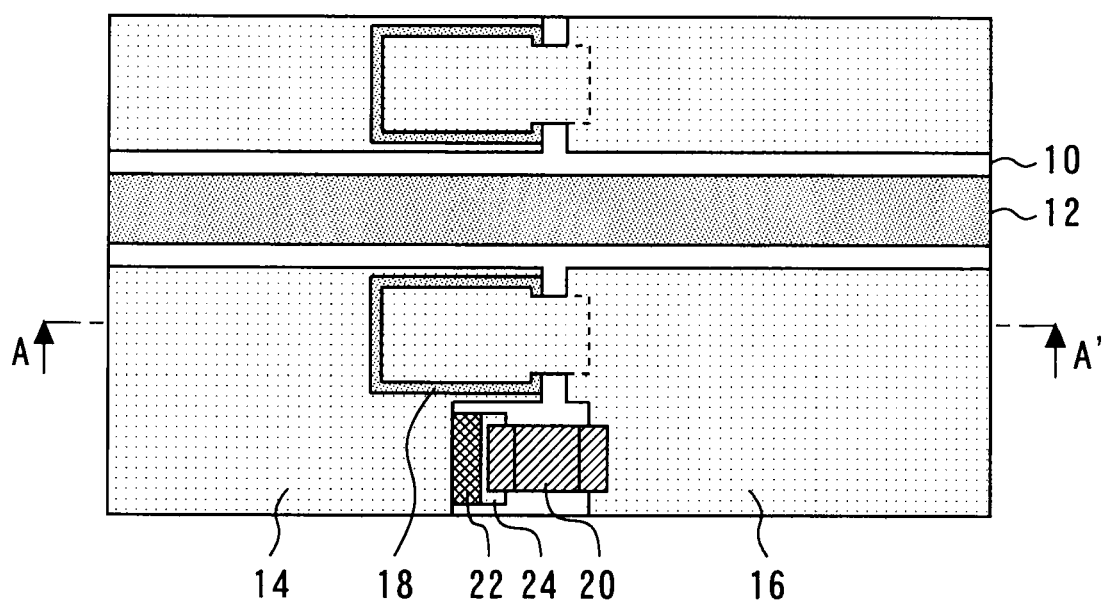
FIG. 1 is a top view showing a transmission line substrate according to a first embodiment of the present invention.
Figure 2:
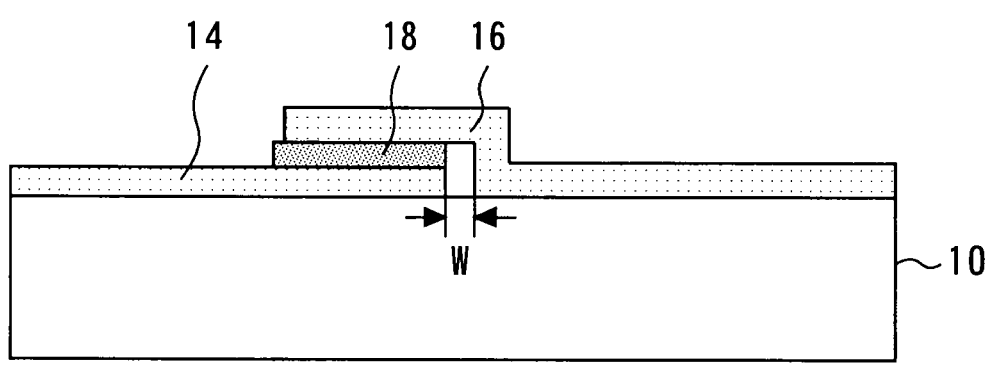
FIG. 2 is a sectional view viewed along the line A-A' shown in FIG. 1.

FIG. 1 is a top view showing a transmission line substrate according to a first embodiment of the present invention. FIG. 2 is a sectional view viewed along the line A-A' shown in FIG. 1.

On the upper surface of a dielectric substrate 10, a signal line 12 (FIG. 1), a first ground conductor 14, and a second ground conductor 16 are formed. The first and the second ground conductors 14 and 16 are field-coupled with the signal line 12 to constitute a coplanar line. The distance between the signal line 12 and the first and the second ground conductors 14 and 16, and the thickness of the signal line 12 are constant, and the impedance is constant. The potential of the first ground conductor 14 is different from the potential of the second ground conductor 16.

In the first embodiment, a dielectric film 18 is formed between an overlapping part of the first ground conductor 14 and a part of the second ground conductor 16. A part of the overlapping first ground conductor 14, the dielectric film 18, and the second ground conductor 16 constitute a MIM (metal-insulator-metal) capacitor.

As shown in FIG. 1, between the first ground conductor 14 and the second ground conductor 16, a chip capacitor 20 is connected in parallel with the dielectric film 18. Between the first ground conductor 14 and the second ground conductor 16, a resistor 22 is connected in series with the chip capacitor 20. An end of the chip capacitor 20 is mounted on a pad 24 connected to the resistor 22; and the other end of the chip capacitor 20 is mounted on the second ground conductor 16.

By using a MIM capacitor for AC coupling of the first ground conductor 14 and the second ground conductor 16 as described above, the width W (FIG. 2) of the gap between the first ground conductor 14 and the second ground conductor 16 where electric fields are distorted can be made to be 50 μm or less. Therefore, the distortion of electric fields in a high frequency of 40 GHz or higher can be reduced, and the deterioration of characteristics can be suppressed.

The capacitance Cs of the MIM capacitor is expressed by:

$$Cs = \in \times \in r \times S/d$$

where $\in$ represents the permittivity, $\in r$, S, and d represent the relative permittivity, the area, and the thickness of the dielectric film 18, respectively.

The impedance Zcs of the dielectric film 18 is expressed by:

$$Zcs = 1/j\omega Cs$$

where j represents the imaginary unit, and ω represents the angular frequency of alternate current.

Since the capacitance Cs of the MIM capacitor is not large, the impedance Zcs of the dielectric film 18 rises as frequency lowers, and loss increases.

To compensate the loss, in the first embodiment, a chip capacitor 20 having a large capacitance (about 0.1 μF) is connected to the dielectric film 18 in parallel. Therefore, the total impedance Zt is expressed by:

$$Zt = 1/\{j\omega(Cs+C1)\}$$

when C1 represents the capacitance of the chip capacitor 20.

At low frequency, since the electrical wavelength is sufficiently long compared with the size of the chip capacitor 20, the distortion of electric fields can be ignored. However, resonance occurs between the MIM capacitor and the chip capacitor 20. Therefore, in the first embodiment, the resistor 22 is connected in series to the chip capacitor 20 to suppress the resonance.

Consequently, since the transmission line substrate according to the first embodiment can AC-couple the first ground conductor 14 and the second ground conductor 16 over a broad band from several tens of kilohertz to 40 GHz or higher, signals can be transmitted over a broad band.

Second Embodiment

Figure 3:
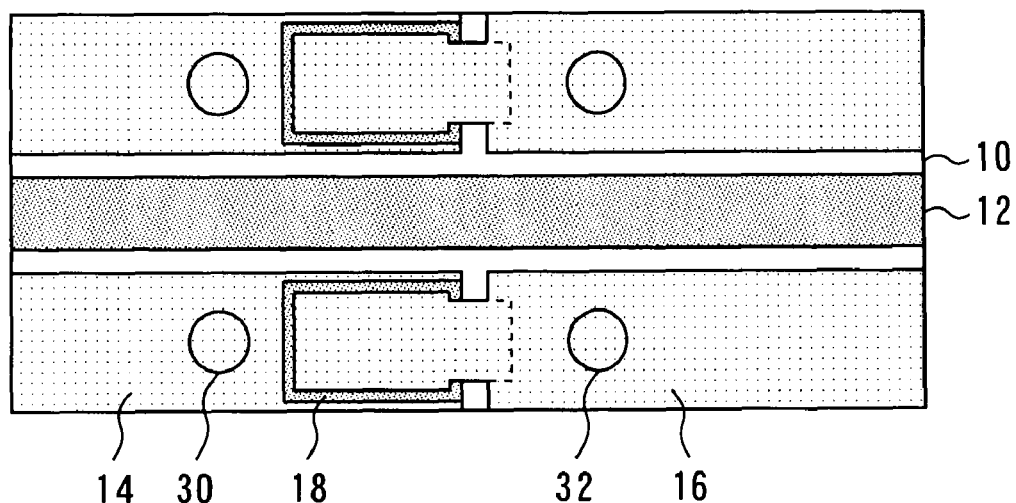
FIG. 3 is a top view showing a transmission line substrate according to a second embodiment of the present invention.
Figure 4:
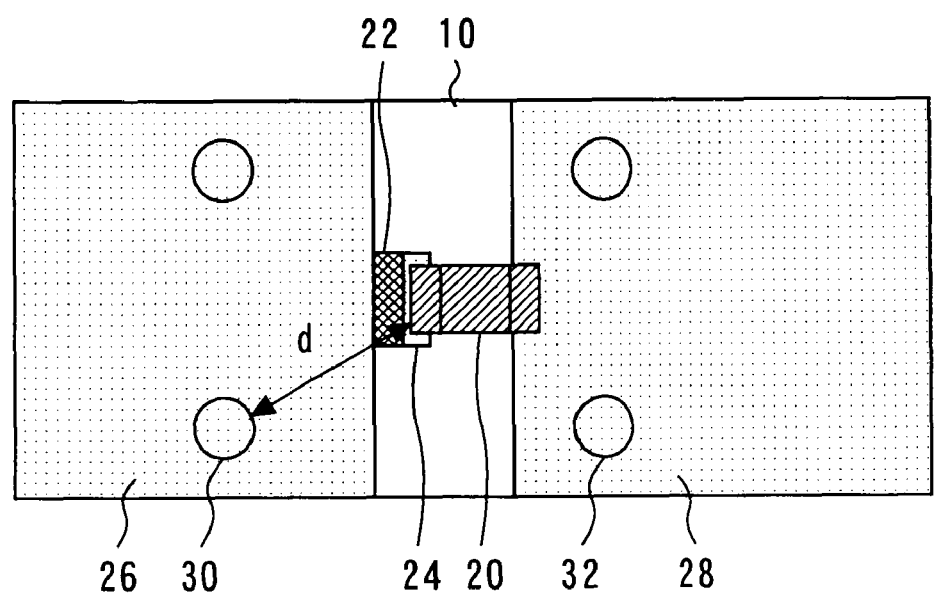
FIG. 4 is a bottom view showing a transmission line substrate according to a second embodiment of the present invention.

FIG. 3 is a top view showing a transmission line substrate according to a second embodiment of the present invention, and FIG. 4 is a bottom view thereof.

With reference to FIG. 3, on the upper surface of a dielectric substrate 10, a signal line 12, a first ground conductor 14, and a second ground conductor 16 are formed. The first and the second ground conductors 14 and 16 are field-coupled with the signal line 12 to constitute a coplanar line. The distance between the signal line 12 and the first and the second ground conductors 14 and 16, and the thickness of the signal line 12 are constant, and the impedance is constant. The potential of the first ground conductor 14 is different from the potential of the second ground conductor 16.

With reference to FIG. 4, on the lower surface of the dielectric substrate 10, a third ground conductor 26 and a fourth ground conductor 28 are formed. The third ground conductor 26 and the fourth ground conductor 28 are connected to the first ground conductor 14 and the second ground conductor 16 by via holes 30 and 32 (also depicted in FIG. 3) penetrating the dielectric substrate 10, respectively.

In the second embodiment, as depicted in FIG. 3, a dielectric film 18 is formed between a part of the overlapping first ground conductor 14 and a part of the second ground conductor 16. An overlapping part of the first ground conductor 14, a part of the dielectric film 18, and a part of the second ground conductor 16 constitute a MIM capacitor. As depicted in FIG. 4, between the third ground conductor 26 and the fourth ground conductor 28, a resistor 22 and a chip capacitor 20 are connected in series. An end of the chip capacitor 20 is mounted on a pad 24 connected to the resistor 22; and the other end of the chip capacitor 20 are mounted on the fourth ground conductor 28.

According to the second embodiment, the equivalent effect as the effect of the first embodiment can be obtained. Moreover, by providing the resistor 22 and the chip capacitor 20 on the lower surface of the dielectric substrate 10, the size of the transmission line substrate can be reduced.

Figure 5:
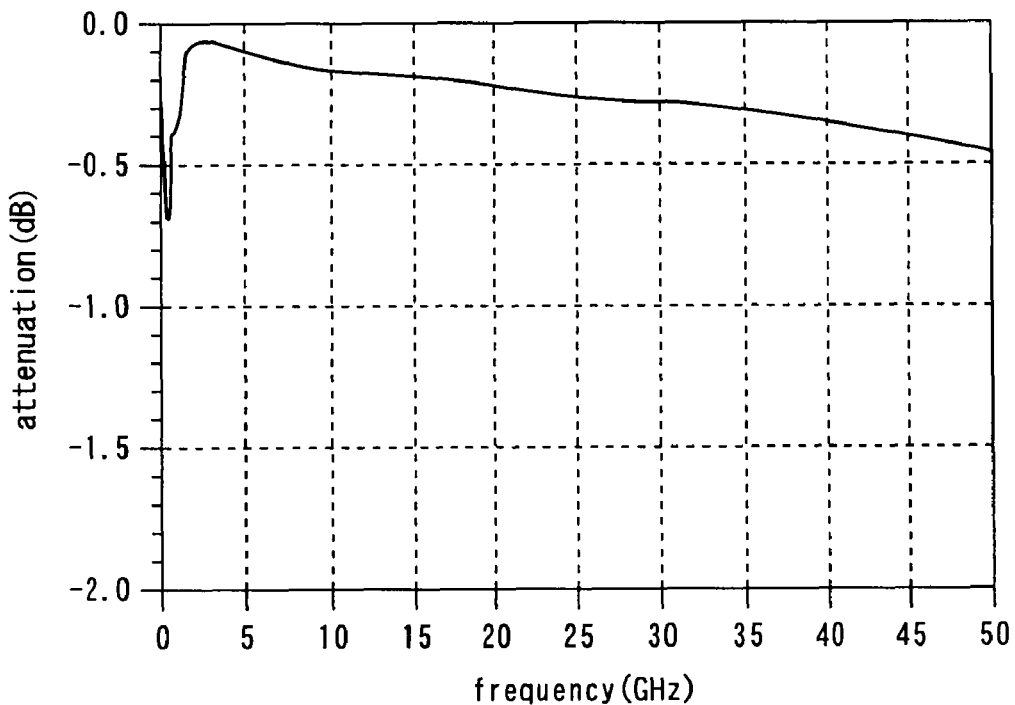
FIG. 5 is a graph showing the transmission characteristics of the transmission line substrate according to the second embodiment of the present invention.
Figure 6:
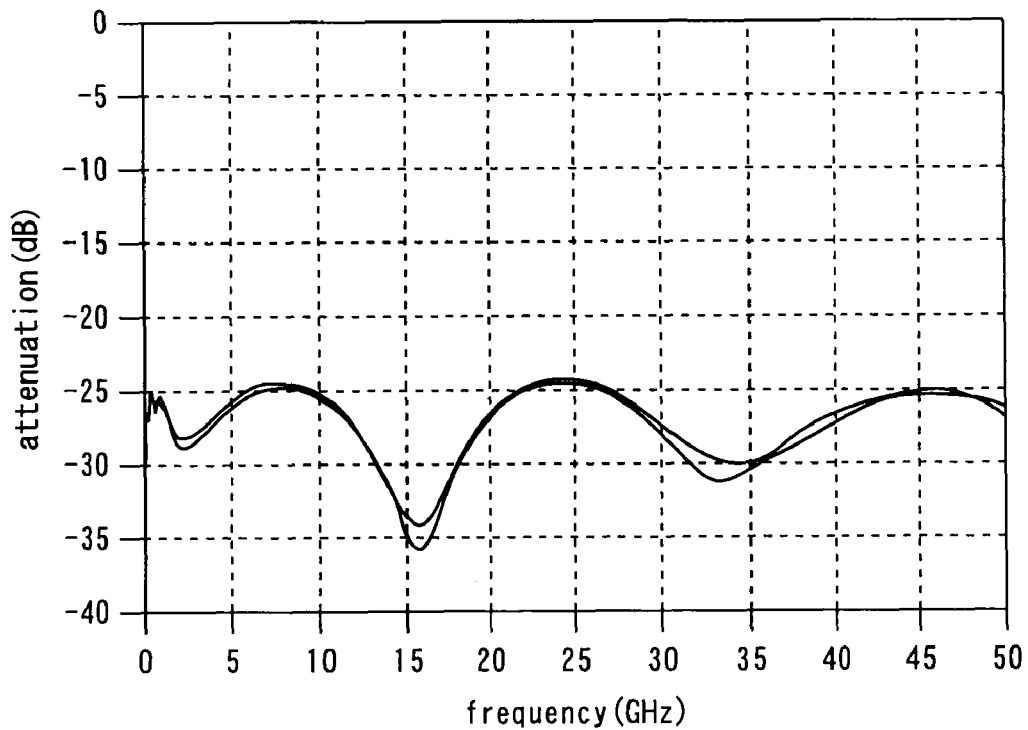
FIG. 6 is a graph showing the reflection characteristics of the transmission line substrate according to the second embodiment of the present invention.

FIG. 5 is a graph of attenuation (dB) versus frequency (GHz) showing the transmission characteristics of the transmission line substrate according to the second embodiment of the present invention; and FIG. 6 is a graph showing the reflection characteristics thereof also of attenuation (dB) versus frequency (GHz). Here, simulation was performed for the case wherein the thickness, the area, and the relative permittivity of the dielectric film 18 are 0.3 µm, 0.1 mm$^2$, and 4, respectively; the capacitance of the chip capacitor 20 is 0.1 µF; and the resistance of the resistor 22 is 4Ω. As a result, a transmission loss of 0.5 dB or less, and reflection characteristics of −20 dB or less could be obtained until 50 GHz.

With reference to FIG. 4, the distance d from the ends of the via holes 30 and 32 to the chip capacitor 20 is preferably ¼ of the wavelength corresponding to the transmission frequency or shorter. Thereby, resonance in the band can be suppressed. The distance d is obtained considering the width of the pad 24 on which the chip capacitor 20 is mounted, the width of the resistor 22, and the land diameters of the via holes 30 and 32.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-231070, filed on Sep. 9, 2008 including specification, claims, drawings and summary, on which the Convention priority of the present application is based, are incorporated herein by reference in its entirety.

What is claimed is:

1. A transmission line substrate comprising:
   a dielectric substrate;
   a signal line disposed on the upper surface of the dielectric substrate;
   first and second ground conductors disposed on the upper surface of the dielectric substrate and each including a part in which the first and second ground conductors overlap each other, field-coupled to the signal line, having potentials different from each other;
   a dielectric film disposed between the part of the first ground conductor and the part of the second ground conductor that overlap each other to constitute a MIM capacitor;
   a capacitor connected between the first ground conductor and the second ground conductor in parallel with the dielectric film; and
   a resistor connected between the first ground conductor and the second ground conductor in series with the capacitor.

2. A transmission line substrate comprising:
   a dielectric substrate;
   a signal line disposed on the upper surface of the dielectric substrate;
   first and second ground conductors disposed on the upper surface of the dielectric substrate, and each including a part in which the first and second ground conductors overlap each other, field-coupled to the signal line, having potentials different from each other;
   third and fourth ground conductors disposed on the lower surface of the dielectric substrate and connected to the first and second ground conductors by via holes penetrating the dielectric substrate, respectively;
   a dielectric film disposed between the part of the first ground conductor and the part of the second ground conductor that overlap each other to constitute a MIM capacitor; and
   a capacitor and a resistor connected in series between the third and fourth ground conductors.

3. The transmission line substrate according to claim 2, wherein a distance from the ends of the via holes to the capacitor is ¼ of the wavelength corresponding to the transmission frequency or shorter.

* * * * *